United States Patent
Afzali-Ardakani et al.

(10) Patent No.: US 7,132,680 B2
(45) Date of Patent: Nov. 7, 2006

(54) ORGANIC FIELD-EFFECT TRANSISTOR AND METHOD OF MAKING SAME BASED ON POLYMERIZABLE SELF-ASSEMBLED MONOLAYERS

(75) Inventors: Ali Afzali-Ardakani, Yorktown Heights, NY (US); Christos D. Dimitrakopoulos, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/456,749

(22) Filed: Jun. 9, 2003

(65) Prior Publication Data

US 2004/0245550 A1    Dec. 9, 2004

(51) Int. Cl.
*H01L 35/24* (2006.01)
*H01L 51/00* (2006.01)

(52) U.S. Cl. .......................... 257/40; 257/213
(58) Field of Classification Search .............. 257/40, 257/213
See application file for complete search history.

(56) References Cited

U.S. PATENT DOCUMENTS

| | | | |
|---|---|---|---|
| 4,200,474 A * | 4/1980 | Morris | 438/762 |
| 5,017,975 A | 5/1991 | Ogawa | |
| 5,081,511 A * | 1/1992 | Tehrani et al. | 257/192 |
| 5,500,537 A | 3/1996 | Tsumura et al. | |
| 6,326,640 B1 | 12/2001 | Shi et al. | |
| 6,913,944 B1 | 7/2005 | Hirai | |
| 6,989,290 B1 | 1/2006 | Aviram | |
| 6,995,506 B1 | 2/2006 | Ogawa | |

FOREIGN PATENT DOCUMENTS

EP     0477515 A1 *    1/1992

OTHER PUBLICATIONS

Wurm, et al., "Organic Monolayers as Nucleation Sites for Epitaxial Growth I. Electrochemical Polymerization of N-Alkylprrole", Langmuir, 1996, pp. 3756-3758, vol. 12, No. 16.

Elisabeth Smela, "Thiol-Modified Pyrrole Monomers 4. Electrochemical Deposition of Polypyrrole over 1-(2-Thioethyl)pyrrole", Langmuir, 1998, pp. 2996-3002, vol. 14, No. 11.

Inaoka, et al., "Chemical and Electrochemical Polymerization of 3-Alkylthiophenes on Self-Assembled Monolayers of Oligothiophene-Substituted Alkylsilanes", Langmuir, 1999, pp. 3752-3758, vol. 15, No. 11.

(Continued)

*Primary Examiner*—Long Pham
(74) *Attorney, Agent, or Firm*—Ido Tuchman, Esq.; McGinn IP Law Group, PLLC

(57) ABSTRACT

An organic field-effect transistor and a method of making the same include a self-assembled monolayer (SAM) of bifunctional molecules disposed between a pair of electrodes as a channel material. The pair of electrodes and the SAM of bifunctional molecules are formed above an insulating layer, in which each of the bifunctional molecules comprises a functionality at a first end that covalently bonds to the insulating layer, and an end-cap functionality at a second end that includes a conjugated bond. The SAM of bifunctional molecules may be polymerized SAM to form a conjugated polymer strand extending between the pair of electrodes.

20 Claims, 2 Drawing Sheets

OTHER PUBLICATIONS

Paul, et al., "Synthesis of Ultrathin Films of Polyacrylonitrile by Photoinitiated Polymerization from Self-Assembled Monolayers on Gold", Langmuir, 2002, pp. 8719-8723, vol. 18, No. 23.

Schmidt, et al. "Photoinitiated Polymerization of Styrene from Self-Assembled Monolayers on Gold", Langmuir, 2002, pp. 1281-1287, vol. 18, No. 4.

Zhao, et al. "Synthesis of Polystyrene Brushes on Silicate Substrates via Carbocationic Polymerization from Self-Assembled Monolayers", Macromolecules, 2000, pp. 342-348, vol. 33, No. 2.

S. Lukas, G. Witte, and Ch. Woll; "Novel Mechanism for Molecular Self-Assembly on Metal Subtrates: Unidirectional Rows of Pentance on Cu(110) Produced by a Substrate-Medicated Repulsion", The American Physical Society, Jan. 2002, vol. 88, No. 2.

* cited by examiner

ORGANIC FIELD-EFFECT TRANSISTOR AND METHOD OF MAKING SAME BASED ON POLYMERIZABLE SELF-ASSEMBLED MONOLAYERS

BACKGROUND OF THE INVENTION

1. Field of the Invention

The present invention generally relates to the polymerization of a self-assembled monolayer (SAM) that contains conjugated π bonds. In particular, the present invention relates to disposing bifunctional molecules on a substrate to form a SAM, where the bifunctional molecules include an end-cap functionality, which is polymerized to form a SAM that is interconnected through conjugated π orbitals to form a charge transport pathway. More particularly, the present invention relates to the fabrication of an organic field-effect transistor, in which the channel material comprises a SAM, which forms an intramolecular charge transport pathway across the channel of the organic field-effect transistor by a conjugated polymer strand.

2. Description of Related Art

Conventional organic field-effect transistors (O-FETs) are based on thin films of organic semiconductors that are deposited on a substrate between two electrodes, i.e., a source and a drain, either by vacuum sublimation or deposition from a solution or a melt. These conventional O-FETs require a large number of molecules to bridge the gap between the source and the drain electrode. In these conventional O-FETs, conduction of the charges through the large number of molecules is facilitated by the large intermolecular overlap between π-electron orbitals of nearest neighbor molecules.

However, even in the best case, where organic molecules are highly aligned and such overlap is maximized, intermolecular charge transport between molecules is hindered by phonon scattering caused by molecular vibrations, which are substantial even at room temperature. Unless the organic molecules of an O-FET are cooled to very low temperatures, where molecular vibrations are reduced significantly or practically eliminated, the charge mobility of organic semiconductors is limited to values on the order of 1 cm$^2$ V$^{-1}$ s$^{-1}$. In these conventional O-FETs, the mobility of charges depends on the intermolecular π-electron overlap between adjacent organic molecules and the weak Van der Waals forces acting between the molecules.

On the other hand, if charge transport occurs via π-electrons of a conjugated molecule, i.e., either a small organic molecule or a single polymer strand, then the charge transport is not restricted by the intermolecular charge transport mechanism described above. To make intramolecular charge transport via π-electrons of a conjugated molecule workable for both very small, i.e., a few nanometers, and for large area O-FETs, the length of the organic semiconductor molecule must be at least equal to the length of the field-effect transistor channel. Since most organic molecules are short, i.e., about 1 to 5 nm in length, relative to the minimum field-effect transistor channel length achievable with existing photolithographic techniques, it is extremely difficult to fabricate O-FETs, whose operation is based on an intramolecular charge transport mechanism, i.e., the transport of charges by the π-electrons of an organic molecule having conjugated bonds.

Polymerization of SAMs, especially the synthesis of a polymer brush, is known in the art. For example, the photopolymerization of acrylonitrile SAMs on the surface of a gold substrate to form a polymer brush has recently been described. Similarly, the polymerization of a SAM containing a styrene end group to form polystyrene brushes has also been described. In these examples, a bifunctional molecule, including an end-cap functionality, is self-assembled on a substrate and the end-cap functionality is polymerized through various means, such as, electrochemical, free radical, or photochemical polymerization. However, these resulting polymers do not contain any π-orbital conjugated bonds, which are necessary for the intramolecular transport of charges.

The polymerization of SAMs comprising pyrrole or thiophene end-cap functionalities, where the end-cap functionalities are used as nucleation sites for the growth of conjugated polymers, is also described in the art. For example, the electrochemical polymerization of pyrrole of a SAM with a pyrrole end-cap functionality, as a means of epitaxial growth of poly(pyrrole) on the SAM's surface, has been described. In these examples, the pyrrole end-cap functionalities of the SAM are used as nucleation sites for polymerization of external pyrrole. Although a conjugated polymer is the end result of this polymerization, this form of polymeric monolayer does not constitute an intramolecular charge transport pathway, which is located parallel to the surface of a substrate.

SAMs have been polymerized to form conjugated π-orbitals, where bifunctional molecules, containing a chlorosilane functionality at one end and a thiophene, a bithiophene, or a terthiophen end-cap functionality on the other end, were self-assembled on a substrate and then polymerized to form polythiophenes, comprising conjugated π-orbital charge transport pathways parallel to the surface of a substrate. However, although the formation of this polymeric SAM was demonstrated by UV-visible spectroscopy and cyclic voltametry, the charge transport properties, e.g., charge mobility, of this polymeric SAM were not measured and no functional electronic device, in which the polymer formed an active element of an electronic device, was constructed. Moreover, no electronic device has been constructed in which charge transport occurred by intramolecular charge transport pathways.

SUMMARY OF THE INVENTION

In view of the foregoing and other problems and disadvantages of conventional techniques, an exemplary aspect of the present invention relates to the fabrication of O-FETs, where the length of the field-effect transistor channel, which may range from about several nanometers to a few micrometers, may be traversed via an intramolecular charge transport mechanism of a conjugated molecule, formed by a self-assembled monolayer (SAM). Hence, the charge mobility through the field-effect transistor channel is not hindered by, for example, phonon scattering, disorder, grain boundaries, etc., and results in a substantial increase in charge mobility of the field-effect transistor channel's material.

Another exemplary aspect of the present invention is the use of these various bifunctional molecules, which may be self-assembled on different substrates and then polymerized to form conjugated π-orbital charge transport pathways, as active channel materials for the fabrication of organic field-effect transistors, in which the charge transport occurs intramolecularly through a conjugated molecular strand within the polymerized SAM.

Another exemplary aspect of the present invention is the fabrication of a field-effect transistor including a SAM of bifunctional molecules on an insulating layer between a pair of electrodes, in which each of the bifunctional molecules comprises a functionality at a first end, which covalently bonds to the insulating layer, and an end-cap functionality at a second end, which includes a conjugated bond. A charge transport pathway may then be formed by an intermolecular charge transport mechanism with overlapping π-orbitals in such a SAM.

In order to attain the above and other advantages and aspects, according to an exemplary embodiment of the present invention, disclosed herein is a field-effect transistor that comprises a pair of electrodes, and a SAM of bifunctional molecules disposed between the pair of electrodes as a channel material.

In another exemplary embodiment of the present invention, the field-effect transistor further comprises an insulating layer over which the pair of electrodes and the SAM of bifunctional molecules are disposed, in which each of the bifunctional molecules comprises a functionality at a first end, which covalently bonds to the insulating layer, and an end-cap functionality at a second end, which includes a conjugated bond.

In another exemplary embodiment of the present invention, the SAM of bifunctional molecules comprises a polymerized SAM that includes a conjugated polymer strand extending between the pair of electrodes.

In another exemplary embodiment of the present invention, the field-effect transistor further comprises a gate electrode that electrically connects to the SAM of bifunctional molecules through the insulating layer.

In another exemplary embodiment of the present invention, the polymerized SAM comprises bifunctional molecules including a 3-substituted, mono-, bi-, or ter-thiophene end-cap functionality, which is polymerized to form the conjugated polymer strand.

In another exemplary embodiment of the present invention, the polymerized SAM comprises bifunctional molecules including an ethynyl end-cap functionality or an ethynl end-cap functionality that is a substituent of an alkyl, an aryl, or a heteroaryl moiety, or an ene-yne end-cap functionality, which is polymerized to form the conjugated polymer strand.

In another exemplary embodiment of the present invention, the SAM comprises bifunctional molecules including a trichlorosilane, a dialkylchlorosilane, a allyldialkylsilane, a trialkoxysilane, a carboxylic acid, a phosphonic acid, a hydroxamic acids, an amine, or a hydroxyl functionality, which covalently bond to the insulating layer.

In another exemplary embodiment of the present invention, the field-effect transistor further comprises a substrate over which the insulating layer is formed, the substrate comprising at least one of glass, polycarbonate, polyester, polyimide, quartz, undoped silicon, and doped silicon.

In another exemplary embodiment of the present invention, the gate electrode comprises at least one of chromium, titanium, copper, aluminum, molybdenum, tungsten, nickel, gold, platinum, palladium, polysilicon, doped polyaniline, doped polythiophene, and doped polypyrrole, and substituted analogues of doped polyanaline, doped polythiophene, and doped polypyrrole.

In another exemplary embodiment of the present invention, the insulating layer comprises at least one of barium strontium titanate, barium zirconate titanate, lead zirconate titanate, lead lanthanum titanate, strontium titanate, barium magnesium fluoride, tanatalum pentoxide, titanium dioxide, and yttrium trioxide.

In another exemplary embodiment of the present invention, the insulating layer comprises at least one of silicon oxide, aluminum oxide, and zirconium oxide.

In another exemplary embodiment of the present invention, the pair of electrodes comprises a source electrode and a drain electrode, the source electrode and the drain electrode comprising at least one of chromium, titanium, copper, aluminum, molybdenum, tungsten, nickel, gold, palladium, platinum, polysilicon, conductive polyaniline, conductive polythiophene, and conductive polypyrrole.

In another exemplary embodiment of the present invention, the pair of electrodes is disposed above and in electrical contact with the SAM of bifunctional molecules.

In another exemplary embodiment of the present invention, a method of making a field-effect transistor comprises forming a SAM of bifunctional molecules, which acts as a channel material, between a pair of electrodes.

In another exemplary embodiment of the present invention, the method of making a field-effect transistor further comprises forming the pair of electrodes and the SAM of bifunctional molecules above an insulating layer, in which each of the bifunctional molecules comprises a functionality at a first end, which covalently bonds to the insulating layer, and an end-cap functionality at a second end, which includes a conjugated bond.

In another exemplary embodiment of the present invention, the method of making a field-effect transistor further comprises polymerizing the SAM by polymerizing an end-cap functionality of the bifunctional molecules to form a polymerized SAM that includes a conjugated polymer strand extending between the pair of electrodes. In another exemplary embodiment of the present invention, the method of making a field-effect transistor further comprises forming a gate electrode that electrically connects to the SAM through the insulating layer.

In another exemplary embodiment of the present invention, forming the SAM of bifunctional molecules comprises immersing the insulating layer in a dilute solution of bifunctional molecules, so that, the bifunctional molecules covalently bond to the insulating layer by the functionality at the first end.

In another exemplary embodiment of the present invention, polymerizing includes at least one of heating, oxidation, electrochemical polymerization, photo-polymerization, free radical polymerization, and catalysis.

In another exemplary embodiment of the present invention, an electronic device comprises a pair of electrodes, and a polymerized SAM of bifunctional molecules, disposed between the pair of electrodes, that acts as a channel.

Thus, an exemplary embodiment of the present invention may fabricate field-effect transistors, where the length of a field-effect transistor channel, which may range from about several nanometers to about a few micrometers, may be traversed via an intramolecular charge transport mechanism of conjugated π-orbitals, formed by polymerization of a SAM of bifunctional molecules. The present invention may use various bifunctional molecules, which may be self-assembled on different substrates and then polymerized to form the conjugated π-orbital charge transport pathways, as active channel materials for the fabrication of field-effect transistors, in which the charge transport occurs intramolecularly through a conjugated polymer strand within the polymerized SAM.

Alternatively, another embodiment of the present invention may fabricate a field-effect transistor including a SAM of bifunctional molecules on an insulating layer between a pair of electrodes, in which each of the bifunctional molecules comprises a functionality at a first end, which covalently bonds to the insulating layer, and an end-cap functionality at a second end, which includes a conjugated bond. A charge transport pathway would be formed by an intermolecular charge transport mechanism over overlapping π-orbitals in such a SAM.

BRIEF DESCRIPTION OF THE DRAWINGS

The foregoing and other aspects of the present invention will be better understood from the following detailed description of exemplary embodiments of the present invention with references to the figures in which.

DETAILED DESCRIPTION OF EXEMPLARY EMBODIMENTS OF THE INVENTION

Generally, the present invention takes advantage of a self-assembly of bifunctional molecules, each of the bifunctional molecules containing a functionality at one end, which forms a covalent bond with a substrate surface, and an end-cap functionality at the other end, which may polymerize with the end-cap functionality of adjacent bifunctional molecules to form a polymerized, self-assembled, continuous, conjugated, charge pathway in the monolayer. In particular, the bifunctional molecules of the present invention may be self-assembled on a substrate located between the source and drain electrodes of an organic field-effect transistor, where the self-assembled monolayer (SAM) provides a highly conductive pathway that uses an intramolecular charge transport mechanism between the source and drain electrodes of a field-effect transistor.

Alternatively, the present invention may fabricate a field-effect transistor including a SAM of bifunctional molecules on an insulating layer between a pair of electrodes, in which each of the bifunctional molecules comprises a functionality at a first end, which covalently bonds to the insulating layer, and an end-cap functionality at a second end, which includes a conjugated bond. A charge transport pathway would be formed by an intermolecular charge transport mechanism with overlapping π-orbitals in such a SAM.

Figure 1A:
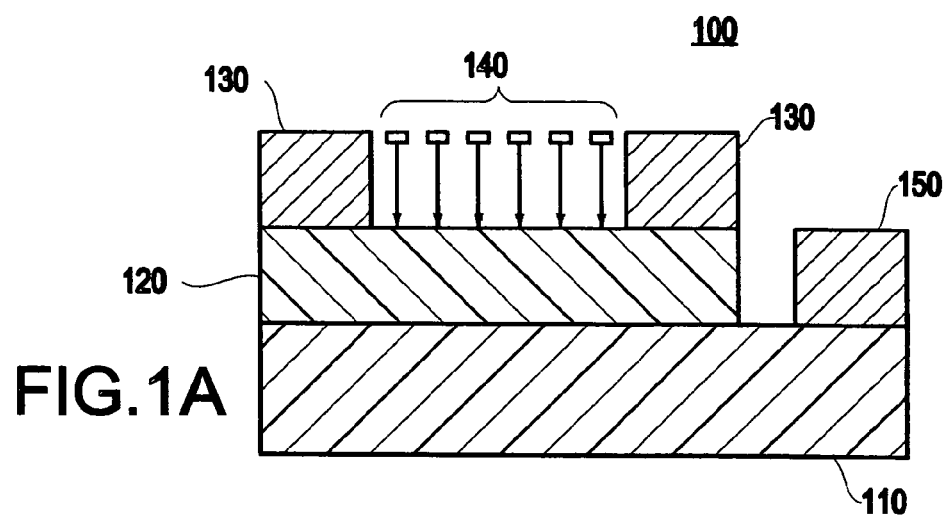
FIG. 1A illustrates a field-effect transistor 100 including a deposition of a self-assembled monolayer (SAM) of bifunctional molecules 140 on an insulating layer 120 located between a pair of electrodes 130 in an exemplary embodiment of the present invention.

Referring to FIG. 1A, an insulating layer 120 may be formed on a substrate 110. In various exemplary embodiments, the substrate 110 may comprise at least one of glass, quartz, undoped silicon, doped silicon, plastics, such as, polycarbonate, polyester, and polyimide, and other substrate materials well known in the art. In various exemplary embodiments, the insulating layer 120 may comprise an oxide, for example, silicon dioxide, aluminum oxide, zirconium oxide, combinations thereof, and other insulating oxides well known in the art, or barium strontium titanate, barium zirconate titanate, lead zirconate titanate, lead lanthanum titanate, strontium titanate, barium magnesium fluoride, tantalum peroxide, titanium dioxide, yttrium trioxide, and combinations thereof, or other insulating materials well known in the art.

The insulating layer 120 may be formed on the substrate 110 by processes well known in the art, including, for example vacuum deposition, thermal growth, solution deposition or lamination.

In various exemplary embodiments, a pair of electrodes 130 may be formed on the insulating layer 120. The pair of electrodes 130 may correspond to a source electrode and a drain electrode of a field-effect transistor. The pair of electrodes 130 may comprise various metals, for example, chromium, titanium, copper, aluminum, molybdenum, tungsten, nickel, gold, platinum, and palladium, or conductive polymers, for example, polyaniline, polythiophene, and polypyrrole, and combinations of these metals or conductive materials. The pair of electrodes 130 may have a thickness of about 20 nm to about 100 nm.

The pair of electrodes 130 may be formed by various deposition processes, for example, evaporation, shadow mask evaporation, sputtering, chemical vapor deposition, electrodeposition, spin coating, electroless plating, inkjet printing, screen printing, and other deposition processes well known in the art.

In various exemplary embodiments, a gate electrode 150 of the field-effect transistor 100 may be formed on the substrate 110. The gate electrode 150 may comprise various metals, for example, chromium, titanium, copper, aluminum, molybdenum, tungsten, nickel, gold, platinum, and palladium, or conductive polymers, for example, doped polyaniline, polythiophene, and polypyrrole, and substituted analogues of polyanaline, polythiophene, and polypyrole, or conductive polysilicon, and combinations of these metals or conductive materials. The gate electrode 150 may have a thickness of about 30 nm to about 500 nm.

The gate electrode 150 may be formed by various deposition processes, for example, evaporation, shadow mask evaporation, sputtering, chemical vapor deposition, electrodeposition, spin coating, electroless plating, and other deposition processes well known in the art.

Referring to FIG. 1A, a SAM of bifunctional molecules 140, which may include a functionality at one end that forms a covalent bond with a surface of a material and an end-cap functionality at the other end that may polymerize with end-cap functionalities of adjacent bifunctional molecules 140, may be deposited on a surface of a substrate by immersion in a dilute solution. Excess bifunctional molecules 140 that are not bound to the surface may be rinsed away.

In various exemplary embodiments, one of the functionalities of the bifunctional molecules 140, which may bond covalently to a substrate surface, may comprise, for example, a trichloro or trialkoxy silane, a chlorodialkylsilane, a dialkylchlorosilane, an allyldialkylsilane, a carboxylic acid, a hydroxamic acid, a phosphonic acid, a hydroxyl, or an amino group.

In various exemplary embodiments, an end-cap functionality, which may be polymerized to form a SAM, may comprise, for example, a 3-substituted mono-, bi-, or ter-thiophene functionality, an ethynl functionality, an ethynl functionality that is a substituent on an alkyl, aryl, or heteroaryl moiety, an isonitrile-substituted aryl, or a conjugated ene-yne functionality.

FIG. 1A shows an exemplary embodiment of a field-effect transistor 100 that includes a SAM of bifunctional molecules 140 formed on an insulating layer 120 between a pair of electrodes 130, in which each of the bifunctional molecules comprises a functionality at a first end, which covalently bonds to the insulating layer 120, and an end-cap functionality at a second end, which includes a conjugated bond. A charge transport pathway would be formed between the pair of electrodes 130 by an intermolecular charge transport mechanism with overlapping π-orbitals in such a SAM.

Figure 1B:
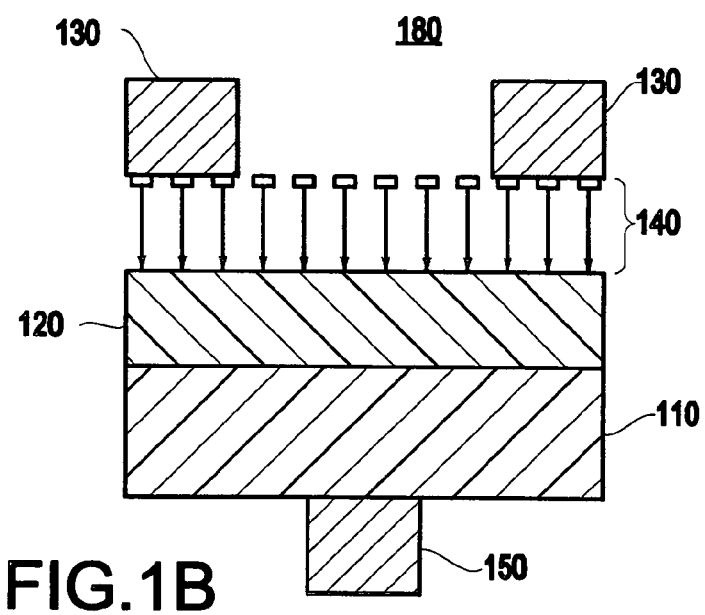
FIG. 1B illustrates a field-effect transistor 180 including a deposition of a SAM of bifunctional molecules 140 on an insulating layer 120, in which a pair of electrodes 130 are formed above the SAM of bifunctional molecules 140 in an exemplary embodiment of the present invention.

Alternatively, FIG. 1B shows an exemplary embodiment in which a pair of electrodes 130 may be formed on the SAM of bifunctional molecules 140, which are disposed on an insulating layer 120, to form a top contact for the pair of electrodes 130 of the field-effect transistor 180. Such a top contact may be formed by various deposition processes, for example, evaporation, inkjet printing, screen printing, and other deposition processes well known in the art.

Figure 2:
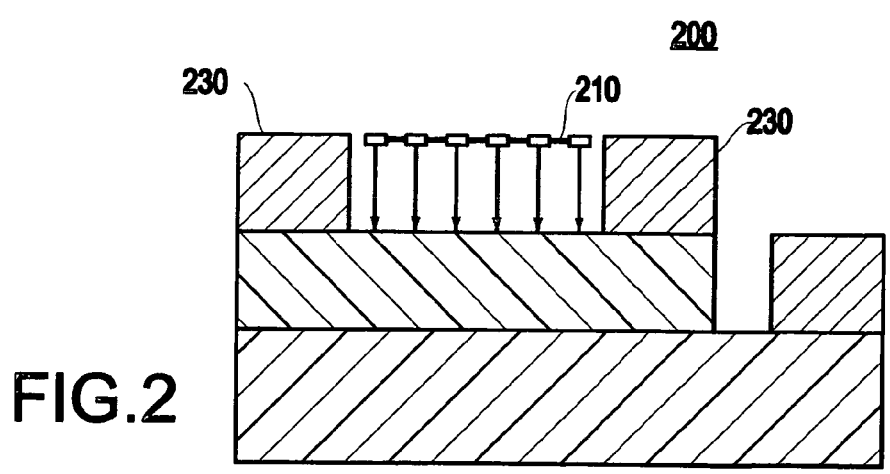
FIG. 2 illustrates a field-effect transistor 200 that includes a polymerized SAM 210.

Referring to FIG. 2, the end-cap functionality of the bifunctional molecules 140 may be polymerized to link all or a series of the end-cap functionalities into a polymerized SAM 210, which includes a continuous, conjugated polymer strand, i.e., an intramolecular charge transport pathway. The polymerized SAM 210 may extend between the pair of electrodes 230 as a conjugated polymer strand, which forms a channel between a source and a drain electrode 230 of a field-effect transistor 200.

For example, a substrate, including an oxide layer, may be immersed in a dilute solution of bifunctional molecules, where each bifunctional molecule includes a functionality of trichlorosilane, which may covalently bond to the oxide layer, and an end-cap functionality of an alkyl-ethynylthiophene, which may be polymerized. The bifunctional molecules may be polymerized by, for example, heating, oxidation, electrochemical polymerization, photopolymerization, free radical polymerization, or catalysis, to form a polymerized SAM 210 of a conjugated poly(thienylacetylene), which constitutes an active channel material forming an intramolecular charge transport pathway. This active channel material may be disposed between the pair of electrodes 130 on the oxide layer to form a channel region of a field-effect transistor 200.

Experimental results that provide examples of bifunctional molecules, which may be self-assembled and polymerized are shown below.

Example 1, above, illustrates a bifunctional molecule including a functionality of a trichloro or trialkoxy silane that binds to a substrate surface and an end-cap functionality of a 3-substituted thiophene ring. In various exemplary embodiments, the bifunctional molecules may bond by one functionality of each bifunctional molecule to an oxide surface, for example, silicon dioxide, aluminum oxide, zirconium oxide, and other oxides well known in the art, which underlies a channel region of a field-effect transistor. The end-cap functionality of these bifunctional molecules may then be oxidized by, for example, chemical or electrochemical means, resulting in polymerization by formation of C—C bonds at the 2, 5 position of the thiophene ring. The result of this polymerization is the formation of an intramolecular charge transport pathway through the conjugated bonds, which may constitute the channel region located between the source and drain electrodes of a field-effect transistor

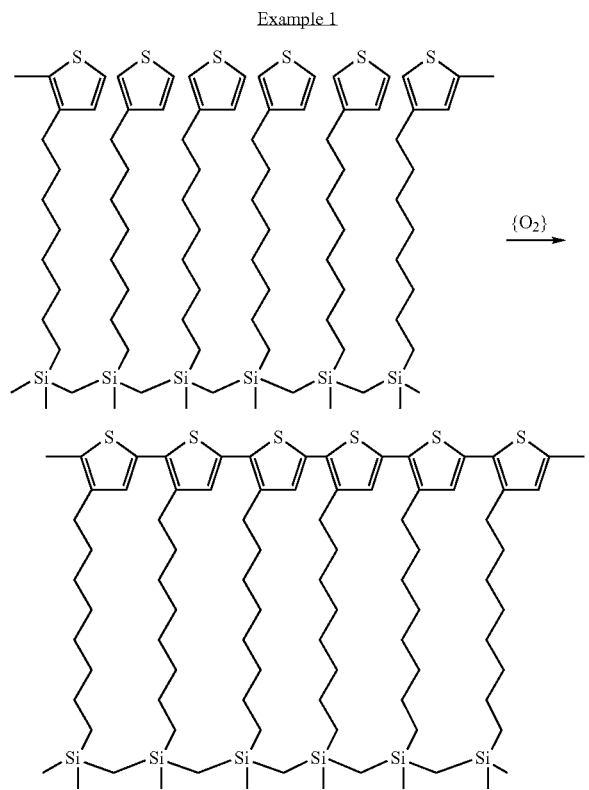

Example 1

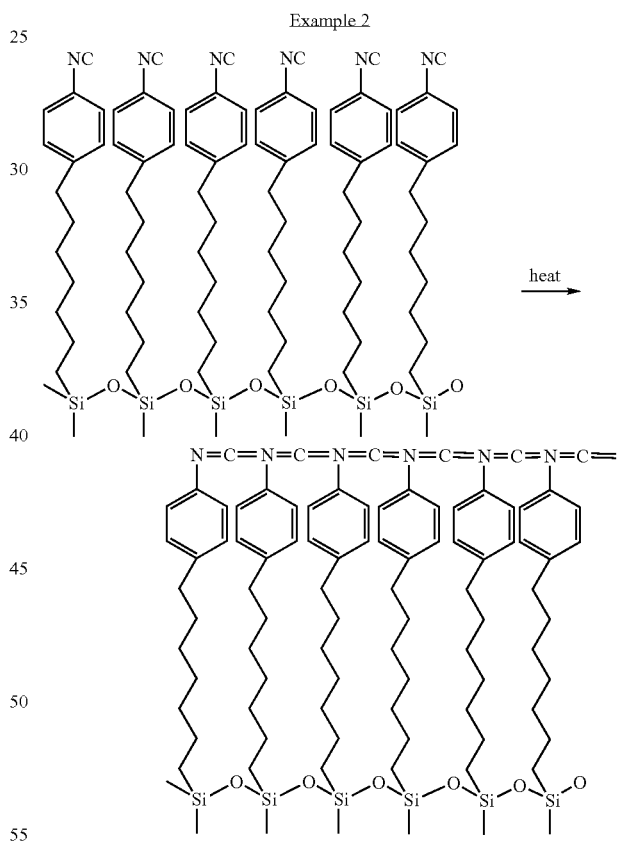

Example 2

Example 2, above, illustrates a thermally induced polymerization of an end-cap functionality of isonitrile in a bifunctional molecule to form a polymerized SAM, which may be disposed on a substrate surface located between the source and drain electrodes of a field-effect transistor. This polymerized SAM includes an intramolecular charge transport pathway through the conjugated bonds, which forms a highly conductive pathway from one end to the other end of the polymerized SAM.

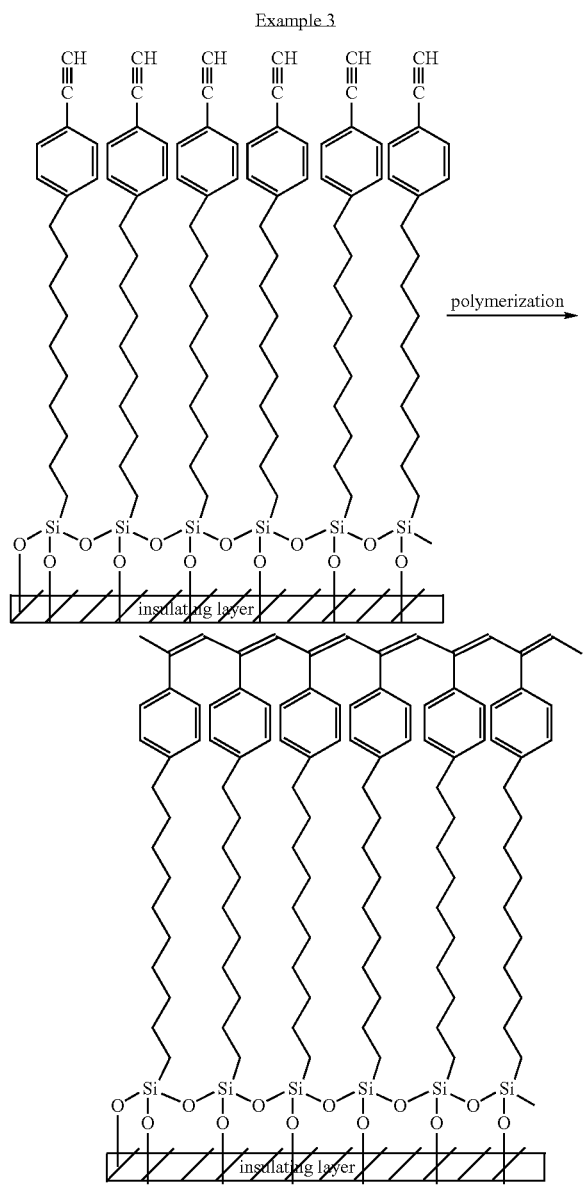

Example 3, above, illustrates a SAM of alkylphenylacetylene on an oxide insulating layer that has been polymerized by dipping in a solution of a catalyst, for example, a Ziegler catalyst, to form polyphenylacetylene at the surface of a polymerized SAM, which may form an intramolecular charge transport pathway between source and drain electrodes of a field-effect transistor.

Figure 3:
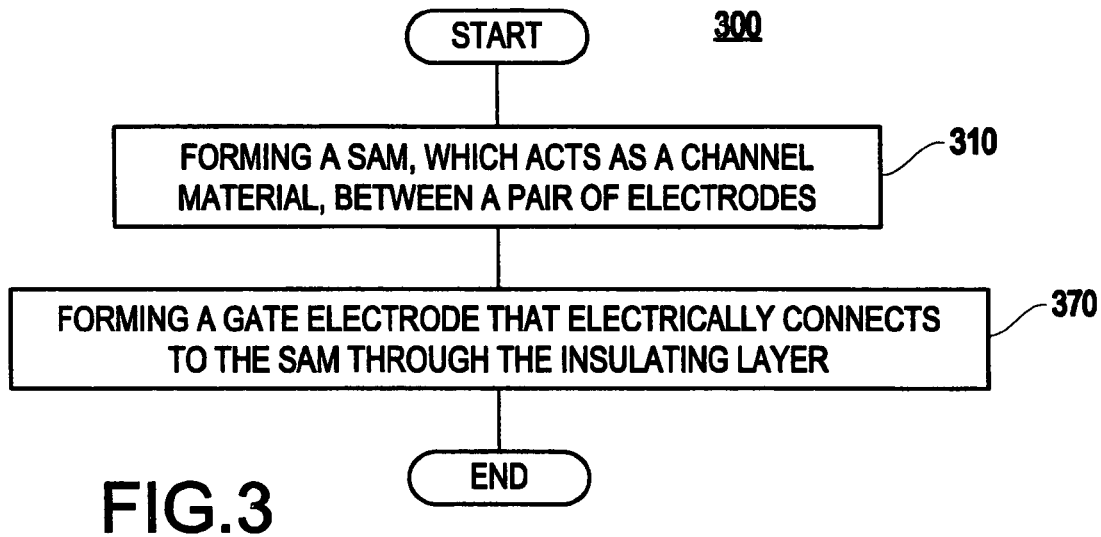
FIG. 3 illustrates a flowchart of a method 300 of making the field-effect transistor 100 of FIG. 1.

FIG. 3 illustrates a flowchart, which describes an exemplary method 300 of making a field-effect transistor according to the present invention. An exemplary embodiment of a method of making a field-effect transistor may comprise forming 310 a SAM of bifunctional molecules, which acts as a channel material, on an insulating layer, and forming 370 a gate electrode that electrically connects to the SAM through an insulating layer. Thus, a charge transport pathway would be formed by an intermolecular charge transport mechanism through overlapping π-orbitals in such a SAM. Alternatively, another exemplary embodiment of a method of making a field-effect transistor may comprise forming a pair of electrodes above a SAM of bifunctional molecules above an insulating layer.

Figure 4:
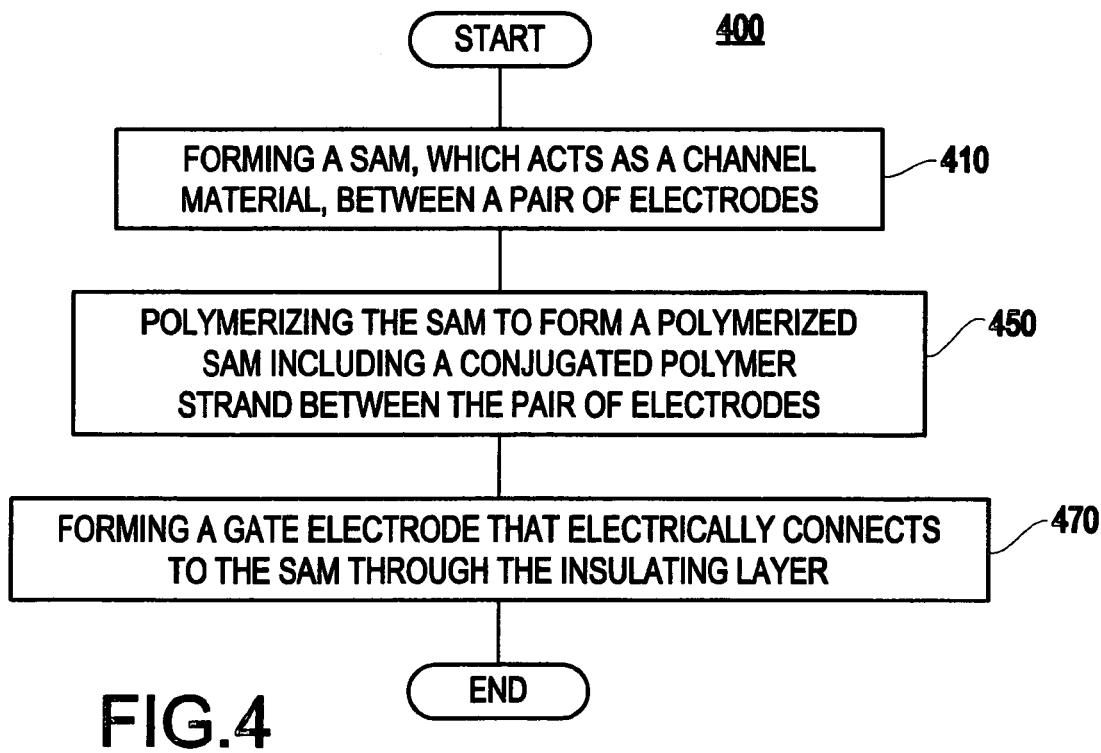
FIG. 4 illustrates a flowchart of a method 400 of making the field-effect transistor 200 of FIG. 2.

FIG. 4 illustrates a flowchart, which describes an exemplary method 400 of making a field-effect transistor, according to the present invention. An exemplary method of making a field-effect transistor may comprise forming 410 a SAM of bifunctional molecules, which act as a channel material, between a pair of electrodes, polymerizing 450 an end-cap functionality of the bifunctional molecules to form a polymerized SAM that includes a conjugated polymer strand extending between a pair of electrodes, and forming 470 a gate electrode that electrically connects to the polymerized SAM through the insulating layer.

While the invention has been described in terms of exemplary embodiments, those skilled in the art will recognize that the invention can be practiced with modifications within the spirit and scope of the appended claims.

Further it is noted that Applicants' intent is to encompass equivalents of all claim elements, even if amended later during prosecution.

Aspects of the present invention relate to the fabrication of field-effect transistors, where the length of the field-effect transistor channel, which may range from about several nanometers to about a micrometer, may be traversed via an intramolecular charge transport mechanism of a conjugated molecule, formed by a polymerized SAM.

Another aspect of the present invention is the use of various bifunctional molecules that may form SAMs, which are polymerized to form conjugated π-orbital charge transport pathways, as active channel materials, for the making of an electronic device, in which charge transport occurs intramolecularly through a conjugated polymer strand within the polymerized SAM.

Another aspect of the present invention may relate to the fabrication a field-effect transistor including a SAM of bifunctional molecules on an insulating layer between a pair of electrodes, in which each of the bifunctional molecules comprises a functionality at a first end, which covalently bonds to the insulating layer, and an end-cap functionality at a second end, which includes a conjugated bond. A charge transport pathway would be formed by an intermolecular charge transport mechanism over overlapping π-orbitals in such a SAM.

We claim:

1. A field-effect transistor, comprising:
 a pair of electrodes;
 an organic self-assembled monolayer (SAM) of bifunctional molecules disposed between the pair of electrodes as a channel material; and
 an insulating layer,
 wherein the SAM comprises bifunctional molecules comprising at least one of a trichlorosilane, a dialkylchlorosilane, an allyldialkylsilane, a trialkoxysilane, a carboxylic acid, a phosphonic acid, a hydroxamic acids, an amine, and a hydroxyl functionality, which covalently bond to the insulating layer.

2. The field-effect transistor of claim 1, wherein the pair of electrodes and the SAM of bifunctional molecules are disposed over said insulating layer,
 wherein each of the bifunctional molecules comprises a functionality at a first end, which covalently bonds to the insulating layer, and an end-cap functionality at a second end, which includes a conjugated bond.

3. The field-effect transistor of claim 1, further comprising:

a gate electrode that electrically connects to the SAM of bifunctional molecules through the insulating layer.

4. The field-effect transistor of the claim 1, wherein the polymerized SAM comprises bifunctional molecules comprising at least one of a 3-substituted, monothiophene end-cap functionality, a 3-substituted, bithiophene end-cap functionality, and a 3-substituted, terthiophene end-cap, which is polymerized to form the conjugated polymer strand.

5. A field-effect transistor, comprising:
a pair of electrodes; and
an organic self-assembled monolayer (SAM) of bifunctional molecules disposed between the pair of electrodes as a channel material,
wherein the SAM of bifunctional molecules comprises a polymerized SAM comprising a conjugated polymer strand extending between the pair of electrodes, and
wherein the polymerized SAM comprises bifunctional molecules comprising at least one of an ethynyl end-cap functionality, and an ethynl end-cap functionality that comprises a substituent of an alkyl, an aryl, and a heteroaryl moiety, and an ene-yne end-cap functionality, which is polymerized to form the conjugated polymer strand.

6. The field-effect transistor of claim 2, further comprising a substrate over which the insulating layer is formed, the substrate comprising at least one of glass, polycarbonate, polyester, polyimide, quartz, undoped silicon, and doped silicon.

7. The field-effect transistor of claim 3, wherein the gate electrode comprises at least one of chromium, titanium, copper, aluminum, molybdenum, tungsten, nickel, gold, platinum, palladium, polysilicon, doped polyaniline, doped polythiophene, and doped polypyrrole, and substituted analogues of doped polyanaline, doped polythiophene, and doped polypyrrole.

8. The field-effect transistor of claim 2, wherein the insulating layer comprises at least one of barium strontium titanate, barium zirconate titanate, lead zirconate titanate, lead lanthanum titanate, strontium titanate, barium magnesium fluoride, tanatalum pentoxide, titanium dioxide, and yttrium trioxide.

9. The field-effect transistor of claim 2, wherein the insulating layer comprises at least one of silicon oxide, aluminum oxide, and zirconium oxide.

10. The field-effect transistor of claim 1, wherein the pair of electrodes comprise a source electrode and a drain electrode, the source electrode and the drain electrode comprising at least one of chromium, titanium, copper, aluminum, molybdenum, tungsten, nickel, gold, palladium, platinum, polysilicon, conductive polyaniline, conductive polythiophene, and conductive polypyrrole.

11. The field-effect transistor of claim 1, wherein the pair of electrodes is disposed above and in electrical contact with the SAM of bifunctional molecules.

12. A charge transport pathway for an electronic device, comprises:

a first terminal; and
a second terminal,
wherein the charge transport pathway comprises a polymerized organic self-assembled monolayer (SAM) of bifunctional molecules, disposed between a first terminal and a second terminal; and
an insulating layer,
wherein the SAM comprises bifunctional molecules comprising at least one of a trichlorosilane, a dialkylchlorosilane, a allyldialkylsilane, a trialkoxysilane, a carboxylic acid, a phosphonic acid, a hydroxamic acids, an amine, and a hydroxyl functionality, which covalently bond to the insulating layer.

13. The field-effect transistor of claim 1, wherein the SAM of bifunctional molecules comprises a polymerized SAM comprising a conjugated polymer strand extending between the pair of electrodes.

14. A field-effect transistor, comprising:
a pair of electrodes; and
an organic self-assembled monolayer (SAM) of bifunctional molecules disposed between the pair of electrodes as a channel material,
wherein the SAM of bifunctional molecules comprises a polymerized SAM comprising a conjugated polymer strand extending between the pair of electrodes, and p1 wherein the polymerized SAM comprises bifunctional molecules comprising at least one of a 3-substituted, monothiophene end-cap functionality, a 3substituted, bithiophene end-cap functionality, and a 3-substituted, terthiophene end-cap, which is polymerized to form the conjugated polymer strand.

15. The field-effect transistor of the claim 14, wherein the polymerized SAM comprises bifunctional molecules comprising a 3substituted, monothiophene end-cap functionality.

16. The field-effect transistor of the claim 14, wherein the polymerized SAM comprises bifunctional molecules comprising a 3substituted, bithiophene end-cap functionality.

17. The field-effect transistor of the claim 14, wherein the polymerized SAM comprises bifunctional molecules comprising a 3substituted, terthiophene end-cap.

18. The field-effect transistor according to claim 5, wherein the polymerized SAM comprises bifunctional molecules comprising an ethynyl end-cap functionality.

19. The field-effect transistor according to claim 5, wherein the polymerized SAM comprises bifunctional molecules comprising an ethynl end-cap functionality that comprises a substituent of an alkyl, an aryl, and a heteroaryl moiety.

20. The field-effect transistor according to claim 5, wherein the polymerized SAM comprises bifunctional molecules comprising an ene-yne end-cap functionality.

* * * * *